United States Patent
Tachibana

(10) Patent No.: US 9,167,708 B2
(45) Date of Patent: Oct. 20, 2015

(54) POWER CONVERSION APPARATUS WITH GROMMET INSERTED INTO CASING

(71) Applicant: DENSO CORPORATION, Kariya, Aichi-pref. (JP)

(72) Inventor: Hideaki Tachibana, Anjo (JP)

(73) Assignee: DENSO CORPORATION, Kariya (JP)

(*) Notice: Subject to any disclaimer, the term of this patent is extended or adjusted under 35 U.S.C. 154(b) by 242 days.

(21) Appl. No.: 13/920,734

(22) Filed: Jun. 18, 2013

(65) Prior Publication Data

US 2013/0335918 A1   Dec. 19, 2013

(30) Foreign Application Priority Data

Jun. 18, 2012  (JP) ................................. 2012-137021

(51) Int. Cl.
*H05K 7/20* (2006.01)
*H05K 5/02* (2006.01)

(52) U.S. Cl.
CPC .......... *H05K 5/0213* (2013.01); *H05K 7/20927* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 4,808,115 A * | 2/1989 | Norton et al. .................... | 439/79 |
| 8,724,313 B2 * | 5/2014 | Nakasaka et al. ......... | 361/679.46 |
| 2005/0194167 A1 * | 9/2005 | Kiyota et al. ............. | 174/17 VA |
| 2009/0025952 A1 * | 1/2009 | Holmes .......................... | 174/15.6 |
| 2010/0218991 A1 * | 9/2010 | Armstrong et al. ......... | 174/74 R |
| 2011/0194246 A1 * | 8/2011 | Nakasaka et al. ............. | 361/688 |
| 2011/0310585 A1 * | 12/2011 | Suwa et al. .................... | 361/820 |

FOREIGN PATENT DOCUMENTS

| | | |
|---|---|---|
| JP | 2007-174801 | 7/2007 |
| JP | 2011-086761 | 4/2011 |
| JP | 2011-171449 | 9/2011 |
| JP | 2011-233794 | 11/2011 |

OTHER PUBLICATIONS

Office Action (1 pg.) dated Jun. 24, 2014 issued in corresponding Japanese Application No. 2012-137021 with an at least partial English-language translation thereof (2 pgs.).

* cited by examiner

*Primary Examiner* — Gregory Thompson
(74) *Attorney, Agent, or Firm* — Nixon & Vanderhye P.C.

(57) ABSTRACT

A power conversion apparatus is equipped with grommets each of which hermetically seals between one of a coolant inlet tube and a coolant outlet tube of a cooler. Each of the grommets has a sealing protrusion and is fit in a cut-out formed in an end of a side wall of a casing with the sealing protrusion pressed against an inner wall of the cut-out. The installation of each of the grommets is achieved by inserting the grommet through the cut-out in a direction from outside to inside the casing so that a portion of the grommet protrudes from the wall into the casing. The visual perception of such protrusion made by an assembly worker, therefore, enables the assembly worker to determine whether the grommet has been installed in place in the cut-out to establish a desired hermetical seal or not.

3 Claims, 7 Drawing Sheets

POWER CONVERSION APPARATUS WITH GROMMET INSERTED INTO CASING

CROSS REFERENCE TO RELATED DOCUMENT

The present application claims benefits of priority of Japanese Patent Application No. 2012-137021 filed on Jun. 18, 2012 the disclosure of which is incorporated herein by reference.

BACKGROUND OF THE INVENTION

1. Technical Field of the Invention

The present invention relates generally to a power conversion apparatus equipped with electronic components such as semiconductor modules, and more particularly to such a power conversion apparatus equipped with a grommet inserted into a wall of a casing to establish a hermetic seal.

2. Background Art

Usually, electric vehicles or hybrid vehicles are equipped with a power conversion apparatus such as an inverter or a DC-DC converter.

The power conversion apparatus is known which is equipped with electronic components such as semiconductor modules which make up a power converter circuit, a cooler which works to cool the electronic components, and a casing in which the electronic components and the cooler are disposed.

The cooler includes a coolant inlet pipe and a coolant outlet pipe. The casing has formed therein cut-out portions through which the coolant inlet pipe and the coolant outlet pipe pass. Elastic grommets are fit in the cut-out portions to hermetically seal air gaps between the coolant inlet pipe and the casing and between the coolant outlet pipe and the casing for avoiding the entry of water into the casing.

Japanese Patent First Publication No. 2011-86761, assigned to the same assignee as that of this application, discloses the above type of power conversion apparatus equipped with a casing and grommets with protrusions on outer peripheries thereof. Specifically, each of the protrusions is in the shape of an annular ring extending on the entire circumference of a corresponding one of the grommets. Each of the grommets is disposed in one of cut-out portions of the casing with the protrusions pressed against an inner surface of the cut-out portion of the casing, thereby hermetically sealing between a corresponding one of the coolant inlet pipe and the coolant outlet pipe and the casing.

The installation of the grommets in the casing is achieved by putting the grommets in the cut-out portions of the casing from openings of the cut-out portions. If each of the grommets is viewed from the opening of the cut-out portion, it is impossible to visually perceive the whole of the protrusions of the grommet, in other words, it is difficult to check whether the protrusions of the grommet are correctly pressed in contact with the inner wall of the cut-out portion to establish a desired hermetic seal therebetween.

SUMMARY

It is therefore an object to provide a power conversion apparatus designed to improve the ease of installation of a grommet in a casing.

According to one aspect of the invention, there is provided a power conversion apparatus which comprises: (a) electronic components constituting a power conversion circuit; (b) a cooler which is equipped with a coolant inlet tube and a coolant outlet tube and works to cool the electronic components; (c) a casing in which the electronic components and the cooler are disposed, the casing having an opening and a wall with an end; (d) cut-outs which are formed in the end of the wall of the casing and extend through a thickness of the wall so as to be exposed to the opening of the casing and through which the coolant inlet tube and the coolant outlet tube pass; and (e) grommets which are disposed one in each of the cut-outs formed in the wall of the casing to and have bodies, respectively, each of the bodies including a hole through which a corresponding one of the coolant inlet tube and the coolant outlet tube hermetically passes and a protrusion pressed against an inner wall surface of a corresponding one of the cut-outs to create a hermetical seal between the body and the cut-out, each of the bodies also including an outer portion and an inner portion which are aligned to each other in a thickness-wise direction of the wall, the outer portion being located on an outward side of the wall of the casing, while the inner portion is located on an inward side of the wall of the casing, the outer portion being equipped with a positioner which serves to fix a location of the grommet when the grommet is inserted into the cut-out in a direction from outside to inside the casing, the inner portion protruding inwardly from the wall when the grommet is fixed in location in the cut-out by the positioner.

Each of the grommets is designed to hermetical seal a gap between the casing and one of the coolant inlet tube and the coolant outlet tube. The installation of each of the grommets in a corresponding one of the cut-outs is achieved by inserting the grommet from the inner portion thereof through the cut-out in a direction from outside to inside the casing. The outer portion of the grommet has the positioner to fix the location of the grommet in the cut-out when the grommet is inserted through the cut-out. When the grommet is fixed in location, the inner portion of the grommet is at least partially placed outside the wall of the casing, in other words, inside the opening of the casing.

The visual perception of projection of the inner portion of the grommet from the wall of the casing made by an assembly worker when the grommet has been fixed in location by the positioner, therefore, enables the assembly worker to determine whether the grommet has been installed in place in the cut-out or not, that is, whether the protrusion of the grommet is placed in elastic contact with the inner wall surface of the cut-out to create the hermetical seal between the grommet and the casing or not. The structure of the grommets, thus, facilitates the ease of checking whether the hermetical seal has been established between each of the coolant inlet tube and the coolant outlet tube and the casing or not without sacrificing the ease of installation of the grommets in the cut-outs.

In the preferred mode of the invention, at least a portion of the inner portion of the body of each of the grommets lying between an end of the inner portion and the protrusion is placed outside the wall of the casing, in other words, projects inward into the opening of the casing.

The positioner of each of the grommets protrudes from a circumferential surface of the body and has a stopper wall which is brought into contact with an outer surface of the wall of the casing when the grommet is inserted into the cut-out of the casing, thereby ensuring the stability in locating the grommet in place in the cut-out.

The wall of the casing has a chamfered surface formed between an outer surface of the wall from which each of the grommets is inserted into a corresponding one of the cut-outs and the inner wall surface of each of the cut-out portions. This facilitates the ease of insertion of the grommet into the cut-out in the direction from outside to the inside the casing, that is, enhances the ease of installation of the grommet in the casing.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
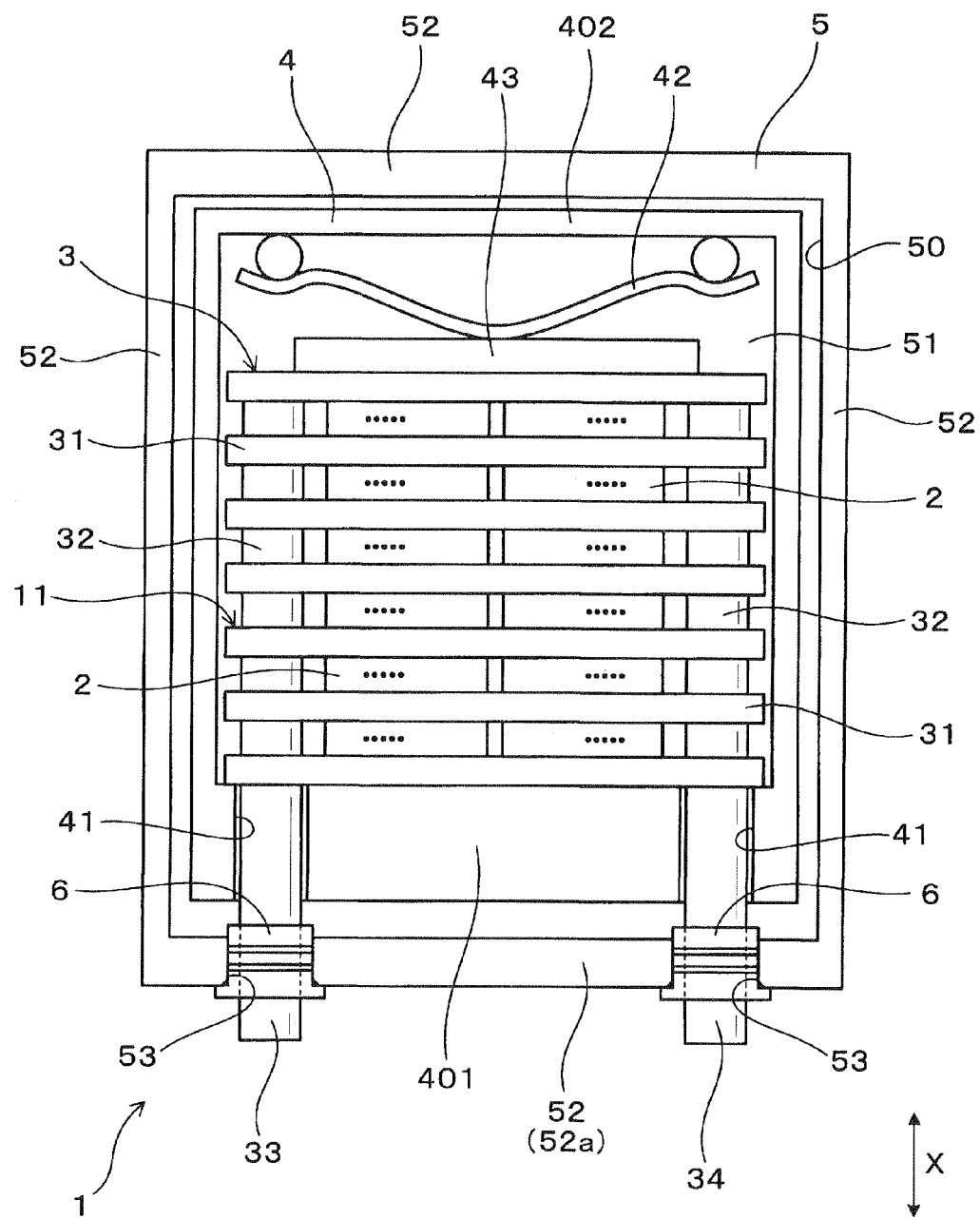
FIG. 1 is a plan view which shows a power conversion apparatus according to an embodiment.

Referring to the drawings, wherein like reference numbers refer to like parts in several views, particularly to FIG. 1, there is shown an electric power conversion apparatus 1 according to the first embodiment of the invention.

Figure 2:
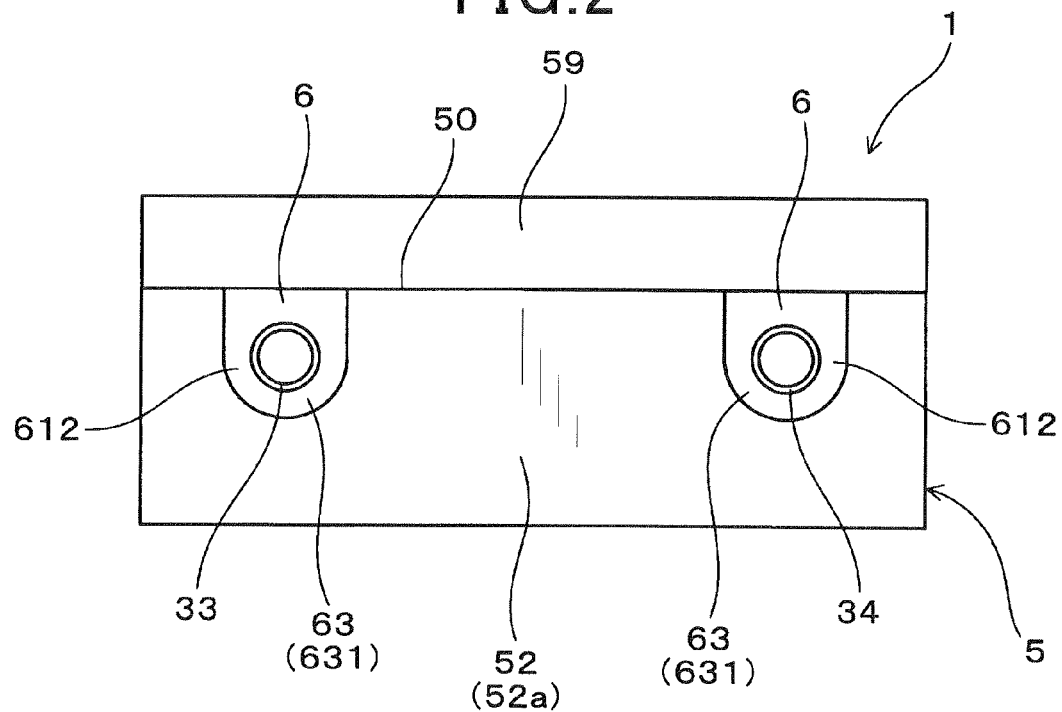
FIG. 2 is a side view which illustrates the power conversion apparatus of FIG. 1 in which grommets are fit in cut-outs of a casing.
Figure 3:
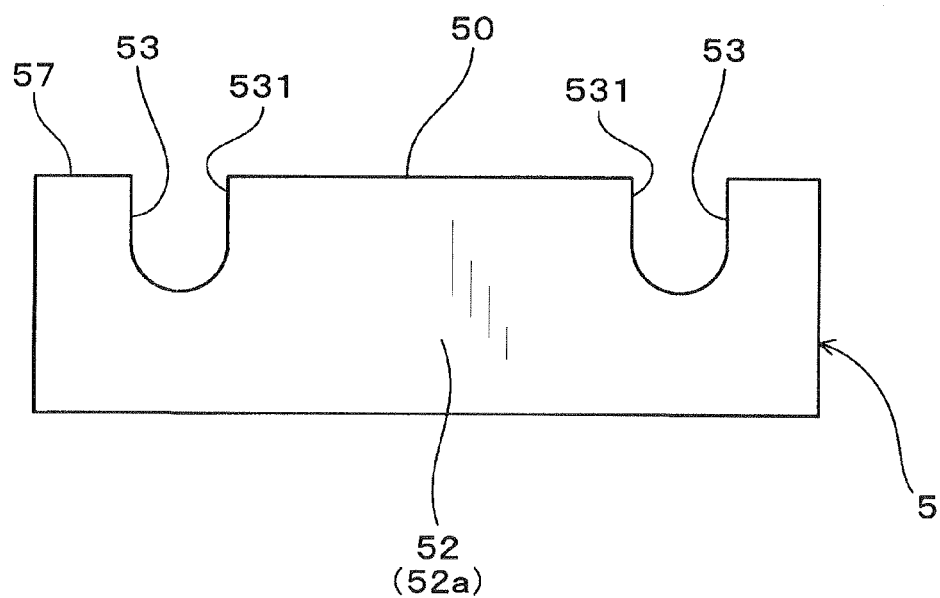
FIG. 3 is a side view of a side wall of a casing of the power conversion apparatus of FIG. 1 in which cut-outs are formed.

The power conversion apparatus 1, as illustrated in FIGS. 1 to 7, includes semiconductor modules 2 (i.e., electronic components) constituting at least a portion of a power converter circuit, a cooler 3 for cooling the semiconductor modules 2, and a casing 5 housing the semiconductor modules 2 and the cooler 3 therein. The power conversion circuit is of a typical structure which is not an essential part of the invention, and explanation thereof in detail will be omitted here. The cooler 3 is equipped with a coolant inlet tube 33 into which coolant is supplied and a coolant outlet tube 34 from which coolant is discharged. The casing 5 has, as can be seen from FIGS. 1, 2, and 3, major sides opposed to each other in a thickness-wise direction of the casing 5 (which will also be referred to as a top side and a bottom side below). At least one of the major sides (i.e., the top side, as viewed in FIG. 3) is opened. In other words, the casing 5 has an opening 50. The casing 5 also includes a rectangular side defined by four side walls 52. The casing 5 may be of another shape such as a round shape. The side walls 52 have, as illustrated in FIG. 3, ends 57 one of which has cut-outs 53 formed therein. The cut-outs 53, as clearly illustrated in FIGS. 2 and 3, define U-shaped openings leading to or exposed to the opening 50. The coolant inlet tube 33 and the coolant outlet tube 34 pass through the cut-outs 53. Grommets 6 are put, one in each of the cut-outs 53.

Figure 6:
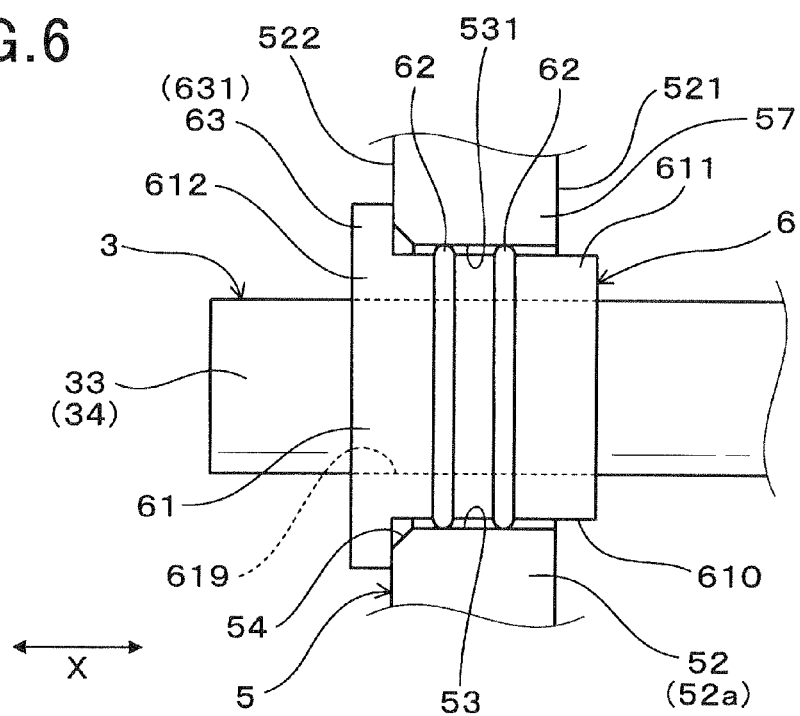
FIG. 6 is a plan view which illustrates a grommet fit in a cut-out formed in a casing of the power conversion apparatus of FIG. 1.
Figure 7:
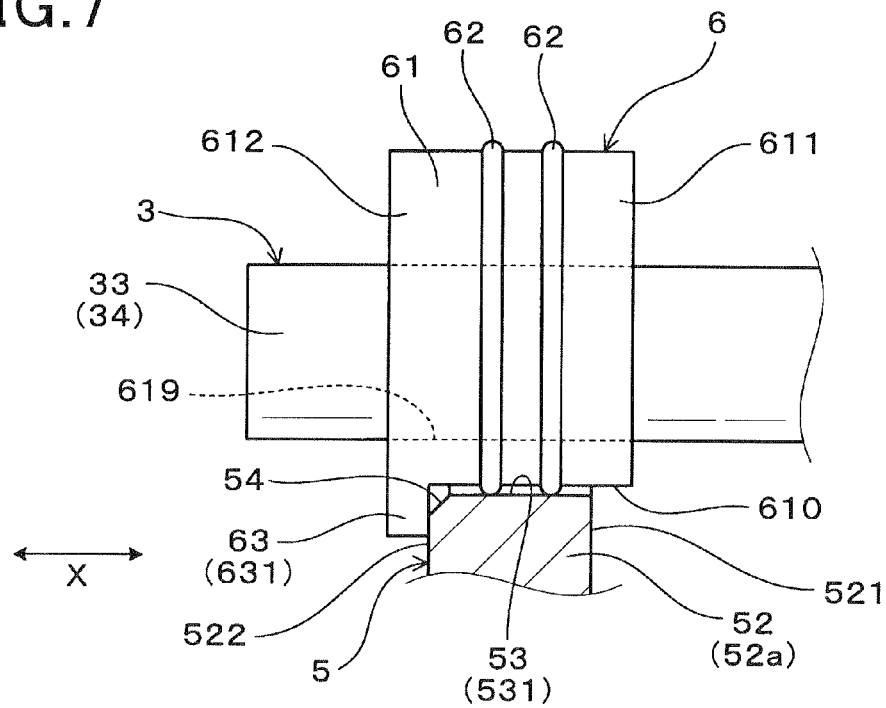
FIG. 7 is a partially vertical sectional view which illustrates a side wall of a casing of the power conversion apparatus of FIG. 1 in which the grommet of FIG. 6 is fit.

The grommets 6, as clearly illustrated in FIGS. 1, 6, and 7, have a length extending in the lengthwise direction of the coolant inlet tube 33 and the coolant outlet tube 34. The installation of each of the grommets 6 in one of the cut-outs 53 is achieved by inserting the grommet 6 into the cut-out 53 in a direction X. Each of the grommets 6 includes an elastic body 61 which is of a U-shape in traverse section and two closed protrusions 62 extending over the whole of a circumferential surface 610 of the body 61. The body 61 has a through hole 619 through which a corresponding one of the coolant inlet tube 33 and the coolant outlet tube 34 is to pass. The protrusions 62 are in the shape of a rib and to be pressed against an U-shaped inner wall surface 531 of a corresponding one of the cut-outs 53. Each of the grommets 6, as clearly illustrated in FIGS. 6 and 7, includes two lengthwise portions: an inserted leading portion 611 and an inserted trailing portion 612 which are aligned with each other in a thickness-wise direction of the side wall 52 of the casing 5 when the grommet 6 is disposed in the cut-out 53. The inserted leading portion 611 is a section of a length of the grommet 6 which is to be first inserted into the hole 619 and located on the inward side of the side wall 52 when the grommet 6 is fit in the cut-out 53. The inserted trailing portion 612 is a section of the length of the grommet 6 which is to be subsequently inserted into the hole 619 and located on the outward side of the side wall 52 when the grommet 6 is fit in the cut-out 53. The inserted leading portion 611 and the inserted trailing portion 612 will also be referred to as an inner portion and an outer portion of the grommet 6, respectively. The inserted trailing portion 612 has a positioner 63 which works to position the grommet 6 in a direction in which the grommet 6 is inserted into the cut-out 53, that is, the thickness-wise direction of the side wall 52a of the casing 5. The positioner 63 is in the shape of a flange and also serves as a stopper to hold the grommet 6 in the cut-out 53. The inserted leading portion 611 of the body 61 is placed partially inside the side wall 52 of the casing 5 when the grommet 6 is fixed in location in the cut-out 53 by the positioner 63.

As illustrated in FIG. 1, the power conversion apparatus 1 is equipped with the semiconductor modules 2 which work as at least a portion of the power converter circuit. Each of the semiconductor modules 2 has switching devices such as insulated gate bipolar transistors (IGBTs) disposed therein.

The cooler 3, as shown in FIG. 1, includes a plurality of cooling tubes 31 each defining a coolant passage therein. The cooling tubes 31 and the semiconductor modules 21 are laid alternately to overlap each other as a stack 11. Each adjacent two of the cooling tubes 31 are joined through deformable joint tubes 32 at their both ends. The cooler 3 includes a coolant inlet tube 33 and a coolant outlet tube 34 which are joined to ends of one of the cooling tubes 31 which is located outermost of the stack 11 in a stacking direction in which the semiconductor modules 2 and the cooling tubes 31 are laid to overlap each other. The coolant inlet tube 33 introduces the coolant from outside the casing 5 to inside the cooling tubes 31. The coolant outlet tube 34 discharges the coolant outside the cooling tubes 31.

The coolant supplied from outside the casing 5 into the coolant inlet tube 33 is delivered to the cooling pipes 33 while passing the joint tubes 32. The coolant flows through each of the cooling tubes 31 in a longitudinal direction thereof. The coolant exchanges heat with the semiconductor modules 2 while flowing through the respective cooling tubes 31. The coolant having a temperature increased by the heat exchange in each of the cooing tubes 31 passes through one of the joint tubes 32 on the downstream side, and is discharged from the coolant outlet tube 34.

As the coolant, there may be used a natural coolant such as water and ammonia, or water mixed with refrigerant such as ethylene glycol, or a fluorocarbon coolant such as fluorinert, or a chlorofluorocarbon coolant such as HCFC 123 and HFC 134a, or an alcoholic coolant such as methanol and alcohol, or a ketone coolant such as acetone.

The assembly of the semiconductor modules 2 and the cooler 3 is, as illustrated in FIG. 1, retained by a rectangular frame 4 and disposed inside the casing 5. The frame 4 surrounds four sides of the assembly of the semiconductor modules 2 and the cooler 3. The frame 4 has a thick wall 401 as one of the two sides opposed in the stacking direction. The thick wall 401 has U-shaped recesses or grooves in which the coolant inlet tube 33 and the coolant outlet tube 34 of the cooler 3 are held.

The stack 11 made up of the semiconductor modules 2 and the cooling tubes 31 has ends opposed to each other in the stacking direction and is disposed inside the frame 4 with one of the ends placed in contact abutment with the thick wall 402. The frame 4 also has a side wall 402 facing the thick wall 401 in the stacking direction. A press plate 43 is placed on an end of the stack 11. A spring 42 is disposed between the side wall 402 of the frame 4 and the press plate 43 to urge the stack 11 into constant abutment with the thick wall 401 of the frame 4.

The casing 5 includes a bottom 51 formed by a rectangular plate and, as described above, the four side walls 52 extending vertically from the bottom 51. Specifically, the casing 5 is of a box shape with an open top (i.e., the opening 50). The casing 5 is casted by metal having a high thermal conductivity such as aluminum.

A side wall 52a that is one of the side walls 52 of the casing 5 has, as described above, the two cut-outs 53 through which the coolant inlet tube 33 and the coolant outlet tube 34 pass.

Each of the cut-outs 53 is, as clearly illustrated in FIG. 3, formed by machining or grinding the end 57 (i.e., a top end surface) of the side wall 52a from above the open top (i.e., the opening 50) of the casing 5 into substantially a semi-ellipse or U-shape. Each of the cut-outs 53 passes through the thickness of the side wall 52a and has the inner wall surface 531 of a U-shape, as viewed from the thickness-wise direction of the side wall 52a.

The side wall 52a of the casing 5, as illustrated in FIGS. 6 and 7, has a tapered or chamfered surface 54 formed between the outer surface 522 and the inner wall surface 531 of each of the cut-outs 53. The outer surface 522 faces the side where the grommets 6 are inserted into the cut-outs 53. The chamfered surface 54 may be flat or round.

Figure 4:
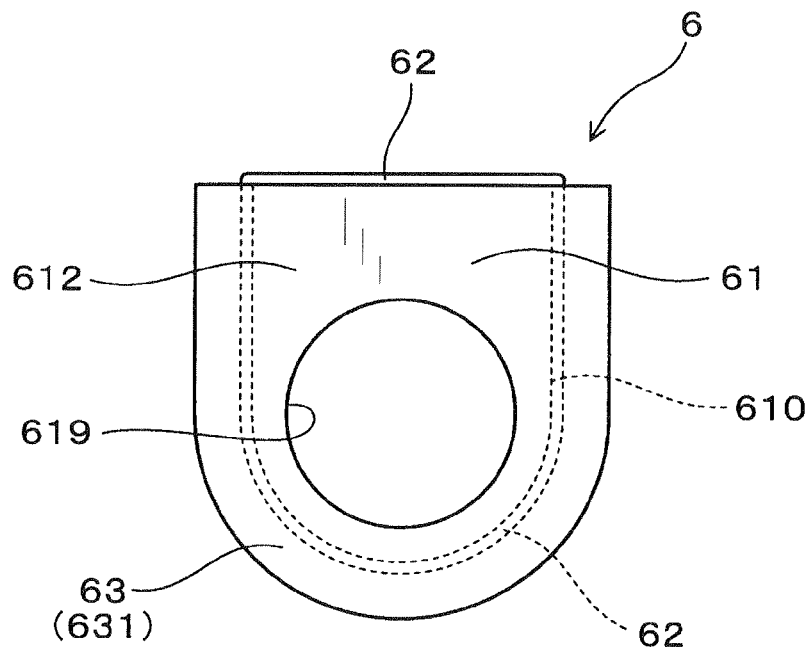
FIG. 4 is a front view which illustrates a grommet, as viewed from a direction opposite a direction in which the grommet is inserted into one of the cut outs of the casing of FIG. 3.
Figure 5:
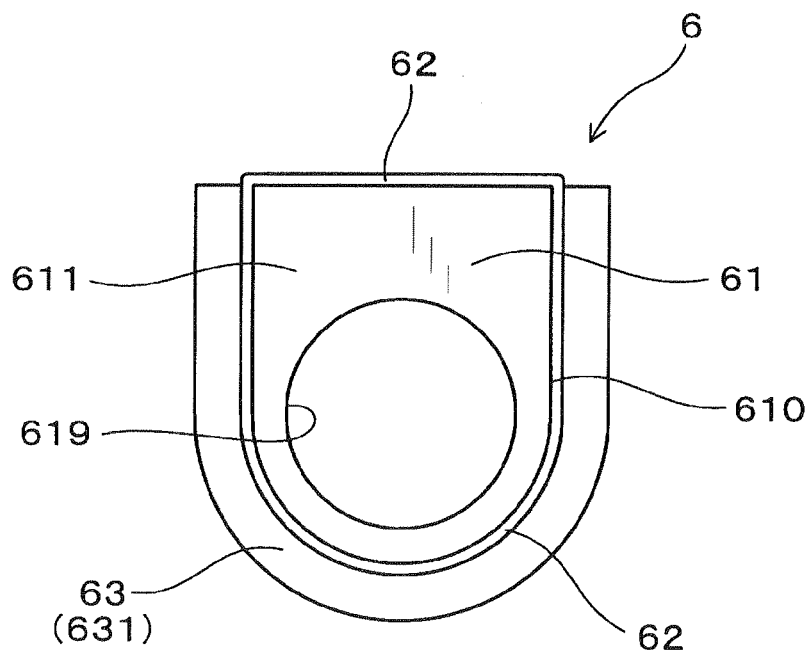
FIG. 5 is a front view which illustrates a grommet, as viewed from a direction in which the grommet is inserted into one of the cut outs of the casing of FIG. 3.

Each of the grommets 6, as illustrated in FIGS. 4 and 5, includes the substantially semi-elliptical or U-shaped cylindrical body 61 and the two protrusions 62 extending substantially parallel to each other on the circumferential surface 610 of the cylindrical body 61. Each of the protrusions 62 is in the shape of a closed annular rib and extends on the whole of the circumferential surface 610. The grommets 6 may be made of elastic material such as rubber.

The cylindrical body 61 of each of the grommets 6, as described above, has the hole 619 extending through the thickness of the cylindrical body 61 in an inserting direction X that is a direction in which each of the grommets 6 is fit into one of the cut-outs 53. The inserted trailing portion 612 of the body 61, as already described, has the positioner 63 which works to position the grommet 6 in the inserting direction X. The positioner 63 has a U-shaped stopper wall 631 which is brought into contact with the outer surface of the side wall 52a of the casing 5 to stop the grommet 6 from moving more inwardly in the inserting direction X. The stopper wall 631 protrudes radially from the circumferential surface 610 of the body 61.

The installation of each of the grommets 6 in one of the cut-outs 53 is, as illustrated in FIGS. 6 and 7, achieved by inserting the grommet 6 into the cut-out 53 from outside the casing 5 in the lengthwise direction (i.e., the direction X) of the coolant inlet tube 33 and the coolant outlet tube 34 of the cooler 3. The coolant inlet tube 33 and the coolant outlet tube 34 are inserted into the holes 619 of the bodies 61 of the grommets 6, respectively. The protrusions 62 of each of the grommets 6 are pressed in contact with the inner wall surface 531 of the cut-out 53 of the casing 5 and a cover or lid 59 for the casing 5 (see FIG. 2) to create a hermetical seal between the grommet 6 and the casing 5 and between the grommet 6 and the lid 59.

The positioner 63 (i.e., the stopper wall 631) of the body 61 of each of the grommets 6 is, as can be seen in FIGS. 6 and 7, placed in contact with the outer surface 522 of the side wall 52a of the casing 5 in the direction X. The inserted leading portion 611 of the body 61 is located outside the side wall 52a of the casing 5, in other words, projects inward into the casing 5 when the grommet 6 is fixed in location by the positioner 63. Specifically, at least a portion of the body 61 lying between the end surface of the inserted leading portion 611 and one of the protrusions 62 which is closer to the end surface of the inserted leading portion 611 is placed outside the inner surface 521 of the side wall 52a of the casing 5.

The lid 59 is, as illustrated in FIG. 2, disposed on the casing 5 to cover the open top (i.e., the opening 50) of the casing 5. The lid 59 is made by pressing a steel plate. The lid 59 is secured firmly to the casing 5 using bolts with a sealing member interposed between itself and the end of the side wall 52 of the casing 5.

How to install each of the grommets 6 in a corresponding one of the cut-outs 53 of the casing 5 will be described below.

Figure 8:
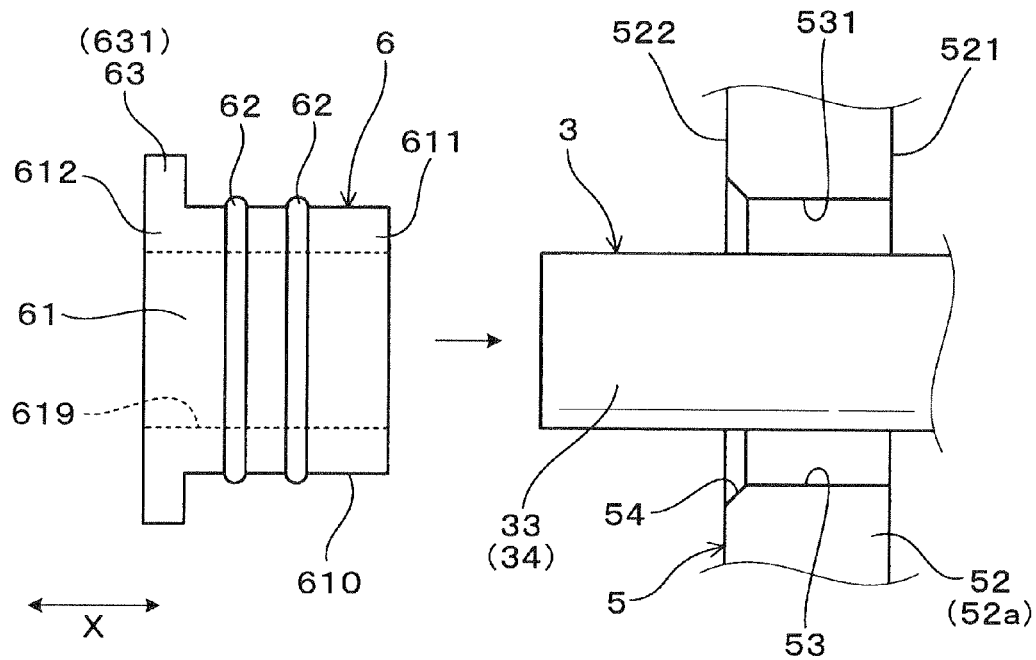
FIG. 8 is an exploded view which demonstrates how to install a grommet on a coolant inlet tube or a coolant outlet tube disposed in a cut-out of a casing of the power conversion apparatus of FIG. 1.

FIG. 8 demonstrates, as an example, the casing 3 in which the coolant inlet tube 33 of the cooler 3 is inserted into the cut-put portion 53. The fitting of the grommet 6 on the coolant outlet tube 34 is the same as on the coolant inlet tube 33, and explanation thereof in detail will be omitted here.

First, the grommet 6 is fitted on the coolant inlet tube 33 disposed in the cut-out 53 of the casing 5. Specifically, the coolant inlet tube 33 is inserted into the hole 619 of the body 61 of the grommet 6, thereby establishing a hermetic seal between the coolant inlet tube 33 and the grommet 6.

Figure 9:
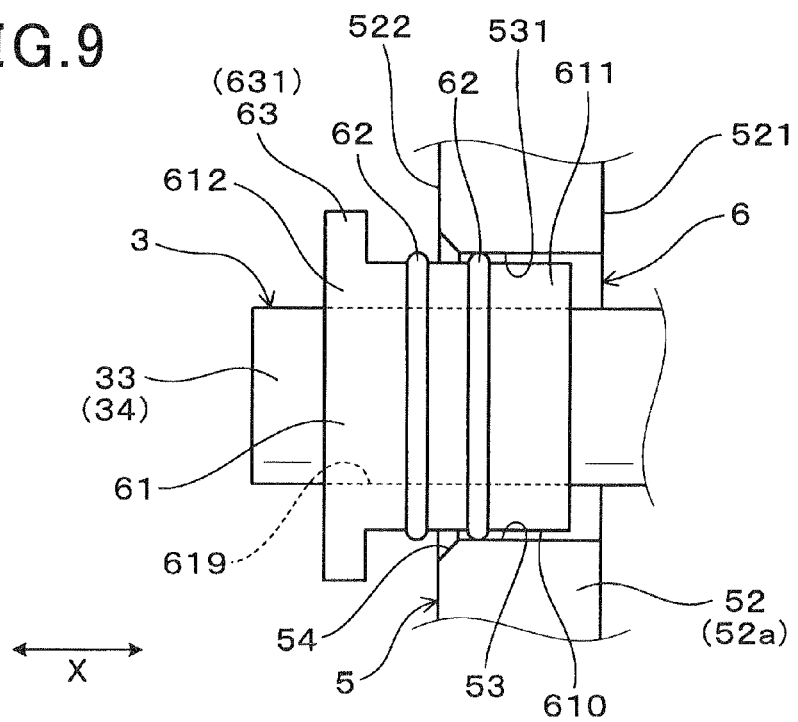
FIG. 9 is a view which illustrates the grommet of FIG. 8 which is inserted partially into the cut out.

Next, the grommet 6 fit on the coolant inlet tube 33 of the cooler 3 is, as illustrated in FIG. 9, thrust more deeply into the cut-out 53 in the direction X until the positioner 63 (i.e., the stopper wall 631) touches the outer surface 522 of the side wall 52a of the casing 5. This fixes, as illustrated in FIGS. 6 and 7, the location of the grommet 6 in the cut-out 53 of the casing 5. The inserted leading portion 611 of the body 61 of the grommet 6 is, as described above, placed outside the inner surface 521 of the side wall 52a of the casing 5, in other words, projects from the inner surface 521 inwardly into the casing 5. By visually perceiving such location of the inserted leading portion 611, it may be checked whether the grommet 6 is disposed in place in the cut-out 53 or not.

In the above steps, each of the grommets 6 is hermetically installed in a corresponding one of the cut-outs 53 of the casing 5.

After the grommets 6 are disposed in the cut-outs 53 of the casing 5, the lid 59 is, as illustrated in FIG. 2, secured to the casing 5 to cover or close the opening 50. The protrusions 62 of each of the grommets 6 are pressed, as illustrated in FIGS. 6 and 7, in constant contact with both the inner surface 531 of the cut-out 53 of the casing 5 and the lid 59 to create a hermetical seal between the grommet 6 and the casing 5 and between the grommet 6 and the lid 59.

Beneficial effects and advantages of the electric power conversion apparatus 1 will be described below.

The grommets 6 are, as described above, inserted into the cut-put portions 53 of the casing 5 in the direction X in which the coolant inlet tube 33 and the coolant outlet tube 34 of the cooler 3 extend and then fitted on the coolant inlet tube 33 and the coolant outlet tube 34. Each of the grommets 6 has the positioner 63 formed on the inserted trailing portion 612 of the body 61 to fix the location of the grommet 6 in the cut-out 53 in the direction X. The inserted leading portion 611 of the body 61 is placed outside the side wall 52a of the casing 5 when the grommet 6 is fixed in location by the positioner 63.

The visual perception of the protrusion of the inserted leading portion 611 of the grommet 6 from the side wall 52a of the casing 5 made by an assembly worker when the grommet 6 has been fixed in location by the positioner 63, therefore, enables the assembly worker to determine whether the grommet 6 has been installed in place in the cut-out 53 or not, that is, whether the protrusions 62 of the grommet 6 are placed in elastic contact with the inner wall surface 531 of the cut-out 53 to create a hermetical seal between the grommet 6 and the casing 5 or not. The structure of the grommets 6, thus, facilitates the ease of checking whether the hermetical seal has been established between each of the coolant inlet tube 33 and the coolant outlet tube 34 and the casing 5 or not without sacrificing the ease of installation of the grommets 6 in the cut-outs 53.

A portion of the inserted leading portion 611 of the body 61 between the end thereof (i.e., the right end, as viewed in FIGS. 6 and 7) and the protrusions 62 (i.e., a right one of the protrusions 62 in FIGS. 6 and 7) is placed at least partially outside the side wall 52 (i.e., the side wall 52a) of the casing 5 when the grommet 6 is retained in place in the cut-out 53 by the positioner 63. In other words, when the grommet 6 is fixed in location by the positioner 63, and the inserted leading portion 611 protrudes inwardly from the side wall 52a into the casing 5, the protrusions 62 are viewed to be disposed correctly in the cut-out 53 and pressed against the inner wall surface 531 of the cut-out 53 to establish a hermetic seal between a corresponding one of the coolant inlet tube 33 and the coolant outlet tube 34 and the casing 5.

The positioner 63 of each of the grommets 6 is formed by a portion of the grommet 6 which protrudes from the circumferential surface 610 of the body 61 and has the stopper wall 631 which is brought into contact with the side wall 52a of the casing 5 when the grommet 6 is inserted into the cut-out 53 in the direction X. Consequently, the desired location of the grommet 6 in the cut-out 53 in the direction X is simply achieved by thrusting the grommet 6 until the stopper wall 631 touches the side wall 52a. This further improves the ease of installation of the grommet 6 in the casing 5.

The side wall 52a of the casing 5 in which the cut-outs 53 are formed, as described in FIGS. 6 and 7, has the chamfered surface 54 lying between the outer surface 522 from which the grommets 6 are inserted into the cut-outs 53 and the inner wall surface 531 of each of the cut-outs 53. This facilitates the ease with which the grommets 6 are inserted into the cut-outs 53 in the direction X, that is, enhances the ease of installation of the grommet 6 in the casing 5.

The cooler 3 of this embodiment is, as can be seen in FIG. 1, configured to define coolant paths in the cooling tubes 31 and arrange the coolant tubes 31 in contact with the semiconductor modules 2, but however, may alternatively be engineered to have the coolant paths through which the coolant flows in direct contact with the semiconductor modules 2.

The spring 42 is, as illustrated in FIG. 1, disposed on one of sides of the stack 11 which are opposed to each other in the stacking direction in which the semiconductor modules 2 and the cooling tubes 31 are laid to overlap each other. The spring 42 works to press the one of the sides of the stack 11 in the stacking direction to hold the stack 11 firmly in the frame 4, but however, may arranged on the other side of the stack 11 to urge the stack 11 in the upward direction, as viewed in FIG. 1.

FIGS. 10 to 13 illustrate modifications of the grommets 6.

Figure 10:
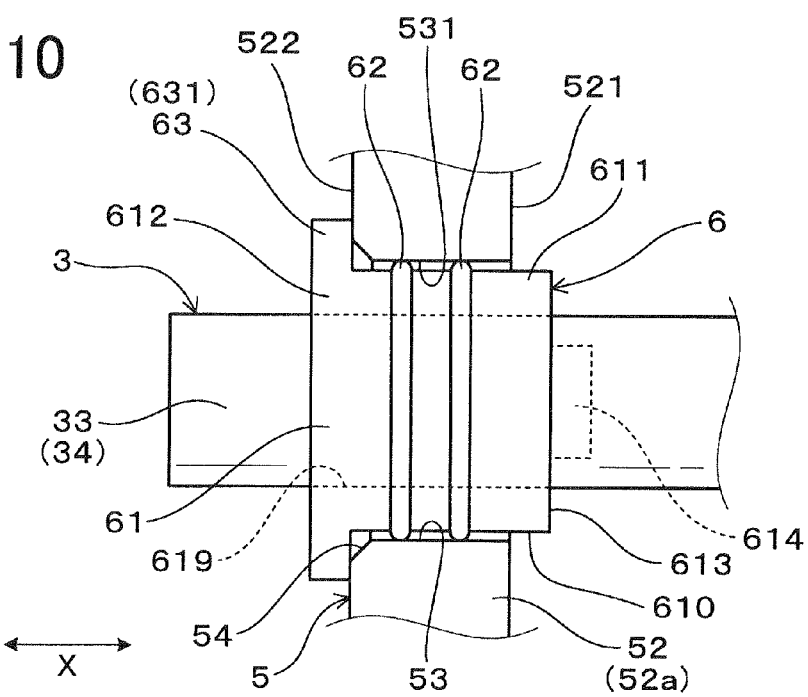
FIG. 10 is a plan view which illustrates a first modification of a grommet fit in a cut-out formed in a casing of the power conversion apparatus of FIG. 1.
Figure 11:
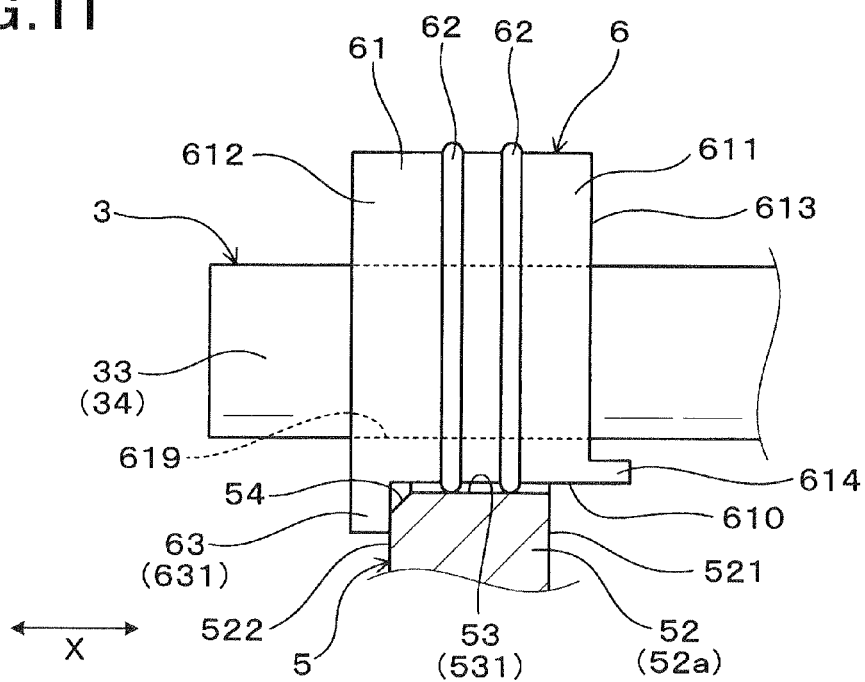
FIG. 11 is a partially vertical sectional view which illustrates a side wall of a casing of the power conversion apparatus of FIG. 1 in which the grommet of FIG. 10 is fit.

The grommet 6, as illustrated in FIGS. 10 and 11, includes a protrusion or tab 614 which extends from the end surface 613 of the inserted leading portion 611 of the body 61 in the direction X (i.e., an axial direction of the grommet 6). The grommet 6 is fit in the cut-out 53 with the tab 614 located close to the bottom of the cut-out 53. In other words, the tab 614 is located farthest away from the opening of the cut-out 53, that is, disposed at a place which is less visible to the assembly worker when the assembly worker inserts the grommet 6 into the cut-out 53 in the direction X. Other structure of the grommet 6 is identical with that in the first embodiment, and explanation thereof in detail will be omitted here.

Figure 12:
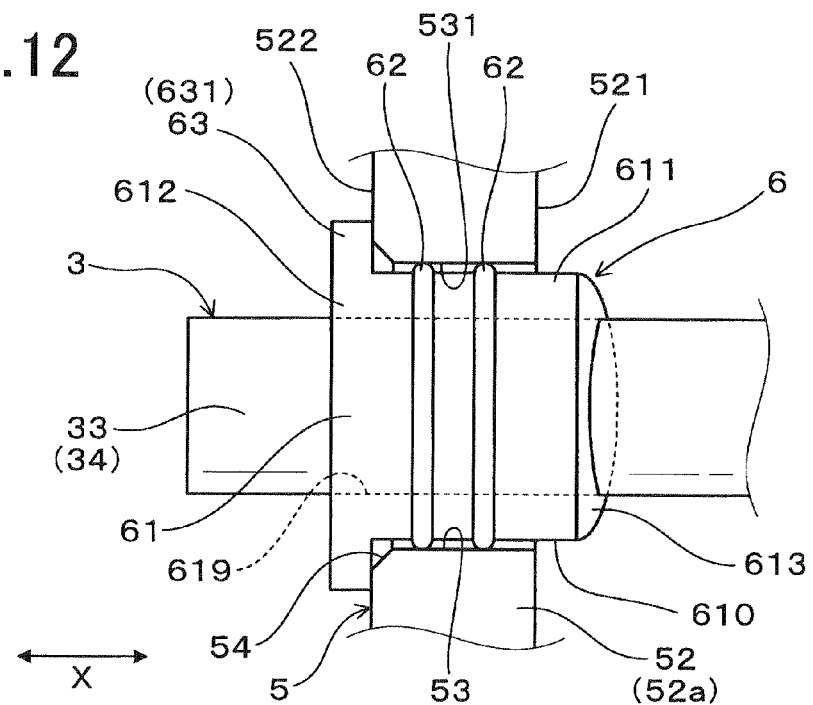
FIG. 12 is a plan view which illustrates a second modification of a grommet fit in a cut-out formed in a casing of the power conversion apparatus of FIG. 1.
Figure 13:
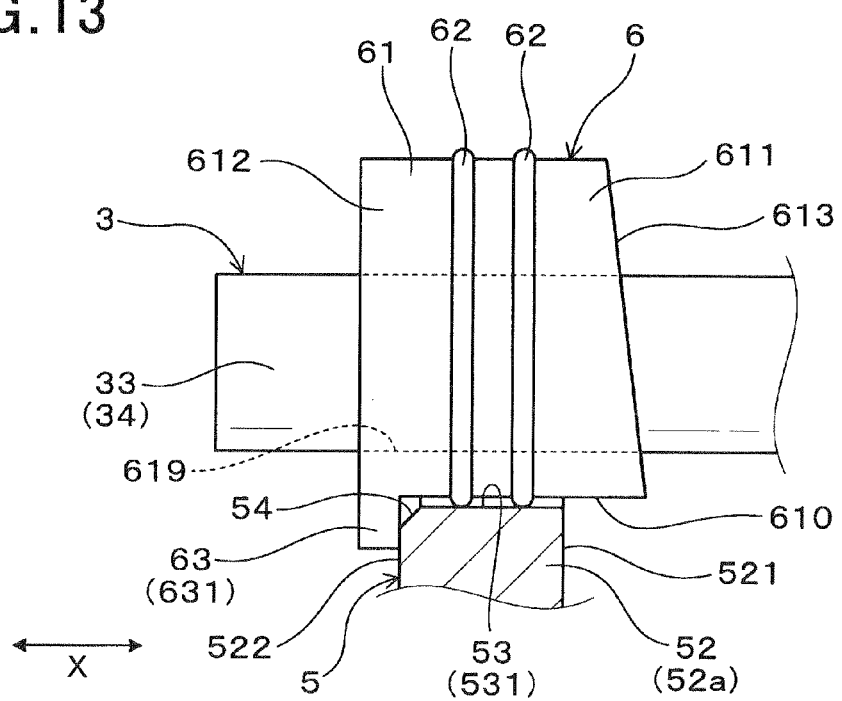
FIG. 13 is a partially vertical sectional view which illustrates a side wall of a casing of the power conversion apparatus of FIG. 1 in which the grommet of FIG. 12 is fit.

FIGS. 12 and 13 illustrates another modification of the grommets 6. The grommet 6 has the inserted leading portion 611 with the end surface 613 inclined or oblique to the axial direction of the grommet 6 so that it protrudes further as approaching a lower portion thereof which will be located close to the bottom of the cut-out 53 when the grommet 6 is fit in the cut-out 53. In other words, a lower portion of the inserted leading portion 611 closer to the bottom of the cut-out 53 is longer than an upper portion thereof, that is, protrudes further away from the protrusions 62 than the upper portion does. Other structure of the grommet 6 is identical with that in the first embodiment, and explanation thereof in detail will be omitted here.

The structure of the grommets 6 in each of the above modifications offers the following advantage.

It may be difficult for the assembly worker to visually perceive whether the lower portion of the inserted leading portion 611 of the grommet 6 which is farther away from the opening of the cut-out 53 has emerged from the side wall 52a of the casing 5, as compared with another portion of the inserted leading portion 611, when the grommet 6 is fitted into the cut-out 53. The grommet 6 of each of the above modifications is designed to have the lower portion of the inserted leading portion 611 of the body 61 which protrudes much more than another portion thereof, thereby facilitating the ease with which the assembly worker visually perceives that the inserted leading portion 611 has emerged from the cut-out 53, that is, that the protrusions 62 of the grommet 6 have desirably created hermetical seals between themselves and the casing 5 when the grommet 6 is installed in the cut-out 53.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

Each of the grommets 6 may be designed to have only either one of the protrusions 62 or three or more protrusions 62.

Each of the grommets 6 may alternatively inserted into one of the cut-outs 53 in a direction from inside to outside the casing 5. For instance, the grommet 6 is first fit on the coolant inlet tube 33 or the coolant outlet tube 34 with the positioner 63 facing the center of the coolant inlet tube 33 or the coolant outlet tube 34 and then inserted into the cut-out 53 until the positioner 63 touches the inner surface 521 of the side wall 52*a* of the casing 5. Alternatively, the grommet 6 is first inserted through the cut-out 53 from inside to outside the casing 5. Subsequently, the coolant inlet tube 33 or the coolant outlet tube 34 is then fitted into the grommet 6.

What is claimed is:

1. A power conversion apparatus comprising:
   electronic components constituting a power conversion circuit;
   a cooler which is equipped with a coolant inlet tube and a coolant outlet tube and works to cool the electronic components;
   a casing in which the electronic components and the cooler are disposed, the casing having an opening and a wall with an end;
   cut-outs which are formed in the end of the wall of the casing and extend through a thickness of the wall so that the cut-outs are exposed to the opening of the casing and through which the coolant inlet tube and the coolant outlet tube pass; and
   grommets which are disposed one in each of the cut-outs formed in the wall of the casing, respectively, each of the grommets having a body, each of the bodies including a hole through which a corresponding one of the coolant inlet tube and the coolant outlet tube hermetically passes and a protrusion pressed against an inner wall surface of a corresponding one of the cut-outs to create a hermetical seal between the body and the corresponding one of the cut-outs, each of the bodies also including an outer portion and an inner portion which are aligned to each other in a thickness-wise direction of the wall, the outer portion being located on an outward side of the wall of the casing, while the inner portion is located on an inward side of the wall of the casing, the outer portion being equipped with a positioner which serves to fix a location of a corresponding one of the grommets when the corresponding one of the grommets is inserted into the corresponding one of the cut-outs in a direction from outside to inside the casing, the inner portion protruding inwardly from the wall when the corresponding one of the grommets is fixed in location in the corresponding one of the cut-outs by the positioner, wherein
   the protrusion is pressed against the inner wall surface of the corresponding one of the cut-outs to create the hermetical seal between the corresponding one of the grommets and the inner wall surface, and
   when the corresponding one of the grommets is fixed in location by the positioner, the inner portion of the body of the corresponding one of the grommets has, between an end of the inner portion and the protrusion, at least a portion which protrudes from the wall of the casing.

2. A power conversion apparatus as set forth in claim 1, wherein the positioner of each of the grommets protrudes from a circumferential surface of the body and has a stopper wall which is brought into contact with an outer surface of the wall of the casing when the corresponding one of the grommets is inserted into the cut-out of the casing.

3. A power conversion apparatus as set forth in claim 1, wherein the wall of the casing has a chamfered surface formed between an outer surface of the wall from which each of the grommets is inserted into a corresponding one of the cut-outs and the inner wall surface of each of the cut-outs.

* * * * *